US008384111B2

(12) United States Patent
Tadatomo et al.

(10) Patent No.: US 8,384,111 B2
(45) Date of Patent: Feb. 26, 2013

(54) METHOD FOR FORMING SAPPHIRE SUBSTRATE AND SEMICONDUCTOR DEVICE

(75) Inventors: Kazuyuki Tadatomo, Ube (JP); Narihito Okada, Ube (JP)

(73) Assignee: Yamaguchi University, Yamaguchi (JP)

( * ) Notice: Subject to any disclaimer, the term of this patent is extended or adjusted under 35 U.S.C. 154(b) by 0 days.

(21) Appl. No.: 13/256,843

(22) PCT Filed: Feb. 9, 2010

(86) PCT No.: PCT/JP2010/000780
§ 371 (c)(1),
(2), (4) Date: Sep. 15, 2011

(87) PCT Pub. No.: WO2010/109750
PCT Pub. Date: Sep. 30, 2010

(65) Prior Publication Data
US 2012/0009768 A1    Jan. 12, 2012

(30) Foreign Application Priority Data
Mar. 23, 2009   (JP) ................................. 2009-070630

(51) Int. Cl.
*H01L 33/00*    (2010.01)
(52) U.S. Cl. .................. 257/98; 257/103; 257/E21.121; 438/29; 438/40
(58) Field of Classification Search .................... 257/98, 257/103, E21.121; 438/29, 40
See application file for complete search history.

(56) References Cited

U.S. PATENT DOCUMENTS

| | | | |
|---|---|---|---|
| 6,410,942 B1 * | 6/2002 | Thibeault et al. ............... | 257/88 |
| 2004/0113166 A1 | 6/2004 | Tadamoto et al. | |
| 2004/0119082 A1 * | 6/2004 | Sugawara ........................ | 257/94 |
| 2006/0046511 A1 | 3/2006 | Shibata et al. | |
| 2008/0261340 A1 * | 10/2008 | Matsuo et al. .................. | 438/29 |
| 2009/0159871 A1 * | 6/2009 | Lee et al. ......................... | 257/13 |

FOREIGN PATENT DOCUMENTS

| | | |
|---|---|---|
| EP | 1378949 | 3/2002 |
| JP | 09-017975 | 1/1997 |
| JP | 2004-35275 | 2/2004 |
| JP | 3595277 | 9/2004 |
| JP | 2005-314121 | 10/2005 |

* cited by examiner

*Primary Examiner* — John C Ingham
(74) *Attorney, Agent, or Firm* — Roberts Mlotkowski Safran & Cole, P.C.

(57) ABSTRACT

In a semiconductor device fabricated by growing a compound semiconductor layer on a sapphire substrate, a sapphire substrate enabling the semiconductor device to have a high light-extraction efficiency is provided.
A plurality of projections 2, 2, . . . are provided at random on a surface of a sapphire substrate 1, and a GaN layer 10 is grown on this surface. Then, a multi-quantum well layer 12, a p-AlGaN layer 14, a p-GaN layer 16, and an ITO layer 18 are formed on the GaN layer 10, and two electrodes 21 and 22 are also formed. In this manner, a semiconductor light-emitting device is fabricated.

12 Claims, 5 Drawing Sheets

METHOD FOR FORMING SAPPHIRE SUBSTRATE AND SEMICONDUCTOR DEVICE

TECHNICAL FIELD

The present disclosure relates to methods for forming sapphire substrates and semiconductor devices.

BACKGROUND ART

Light-emitting diodes (LEDs) are often used for various types of lighting devices, illumination, electronic equipment, and the like, for their high energy conversion efficiencies and long lives. An LED capable of emitting visible light is generally fabricated using AlGaInN (hereinafter typified by GaN) or a Group III-V compound semiconductor material of AlGaInP GaN is used for LEDs which emit green light, blue light, or ultraviolet light. AlGaInP is used for LEDs which emit red light, orange light, or yellow light.

At present, GaN crystal is grown on a sapphire ($Al_2O_3$) substrate in consideration of, for example, cost and quality. In the GaN layer grown on the sapphire substrate, however, threading dislocation serving as a high-density nonradiative recombination center occurs in GaN crystal because of lattice mismatch between a sapphire crystal lattice and a GaN crystal lattice. Accordingly, an optical output (i.e., an external quantum efficiency) and a durability life decrease, and a leakage current increases.

In addition, GaN has an refractive index of about 2.4 and the sapphire substrate has an refractive index of about 1.8 in the wavelength range of blue light, i.e., the difference in refractive index between GaN and the sapphire substrate is large in this wavelength range. Accordingly, about 70% of light emitted from an InGaN/GaN multi-quantum well layer is confined in the GaN layer including the multi-quantum well layer due to total internal reflection, and is either self-absorbed in the multi-quantum well layer during transmission in the GaN layer, or absorbed in, for example, an electrode, to be finally converted into heat. That is, total internal reflection due to the difference in refractive index greatly reduces the light-extraction efficiency of an LED.

To reduce threading dislocation as described above, or to increase the light-extraction efficiency, a technique for growing a GaN layer and an AlGaN layer using a so-called patterned sapphire substrate (PSS) provided with unevenness formed by previously etching a surface of a sapphire substrate on which a GaN layer is to be grown is proposed (see, for example, PATENT DOCUMENT 1).

CITATION LIST

Patent Document

PATENT DOCUMENT 1: Japanese Patent No. 3595277

SUMMARY OF THE INVENTION

Technical Problem

The conventional PSS as proposed in PATENT DOCUMENT 1 is a sapphire substrate having a surface provided with a pattern of a plurality of parallel grooves or geometric shapes in which domes, cylindrical columns, square poles, or hexagonal projections are regularly arranged.

In general, formation of such a regular pattern requires a photomask or a die having a pattern designed to prevent reduction of the internal quantum efficiency and a large number of process steps using expensive light-exposure apparatus or nanoimprinting apparatus. These requirements cause an increase in cost for fabricating LED devices.

Further, a periodic pattern causes the light-extraction efficiency to have direction dependency, resulting in that distribution of light emitted from an LED device has anisotropy. Specifically, in a case where periodic arrays of the pattern are perpendicular to each other in the direction of transmission of light in the GaN layer, the light-extraction efficiency from the surface of the LED device increases. On the other hand, in a case where the periodic arrays are parallel to each other, the light-extraction efficiency approximately equal to that from the flat surface of a general sapphire substrate is obtained.

As described above, the cost of fabricating a conventional PSS having a regular pattern might increase. In addition, anisotropy of the light-extraction efficiency causes anisotropy in distribution of light emitted from an LED device, resulting in problems occurring in use for, for example, lighting devices or electronic equipment requiring high efficiency and uniform light emission.

It is therefore an object of the present disclosure to provide a method for easily fabricating an inexpensive sapphire substrate which serves as a substrate of a semiconductor device having a high light-extraction efficiency and in which light distribution of an LED device formed on the sapphire substrate is less anisotropic.

Solution to the Problem

To solve the above-described problems, a method for forming a sapphire substrate according to the present disclosure includes: (A) depositing a metal by evaporation on a surface of a thin sapphire plate; (B) performing heat treatment on the thin sapphire plate, thereby changing the metal into a fine particle state, after step A; and (C) etching the surface of the thin sapphire plate using the metal in the fine particle state as a mask.

In step (A), the metal may be deposited by evaporation to have a thickness from 1 nm to 20 nm, both inclusive.

In step (C), a plurality of projections may be formed on the surface, the projections may be arranged at random on the surface, each of the projections may be tapered from a bottom thereof to a top thereof, and a flat portion of the top of each of the projections may have an area of 0 $\mu m^2$ to 0.05 $\mu m^2$, both inclusive.

A bottom surface of each of the projections may have a longer diameter of 100 nm to 1 $\mu m$, both inclusive, and a shorter diameter of 50 nm to 0.5 $\mu m$, both inclusive, and the projections may be arranged at a density of $1 \times 10^6/cm^2$ to $5 \times 10^{10}/cm^2$, both inclusive.

Each of the projections may have a curved side surface.

Each of the projections may have a height of 100 nm to 1 $\mu m$, both inclusive.

A plurality of convex shapes may be provided at random on the surface of the thin sapphire plate, each of the convex shapes may be tapered from a bottom thereof to a top thereof, the convex shapes may be arranged at a density of $1 \times 10^5/cm^2$ to $5 \times 10^7/cm^2$, both inclusive, a flat portion of the top of each of the convex shapes may have an area larger than 0 and smaller than or equal to 10 $\mu m^2$, and a bottom surface of each of the convex shapes may have a longer diameter of 1 $\mu m$ to 50 $\mu m$, both inclusive, and a shorter diameter of 100 nm to 10 $\mu m$, both inclusive.

A semiconductor device according to the present disclosure includes: a sapphire substrate formed with the above-described method for forming a sapphire substrate; and a compound semiconductor layer is provided on the surface of the sapphire substrate.

Advantages of the Invention

A plurality of tapered projections can be arranged at random on a sapphire substrate through a small number of process steps at low cost. The use of this substrate enables fabrication of a light-emitting diode exhibiting a high light-extraction efficiency.

DESCRIPTION OF EMBODIMENTS

Figure 1:
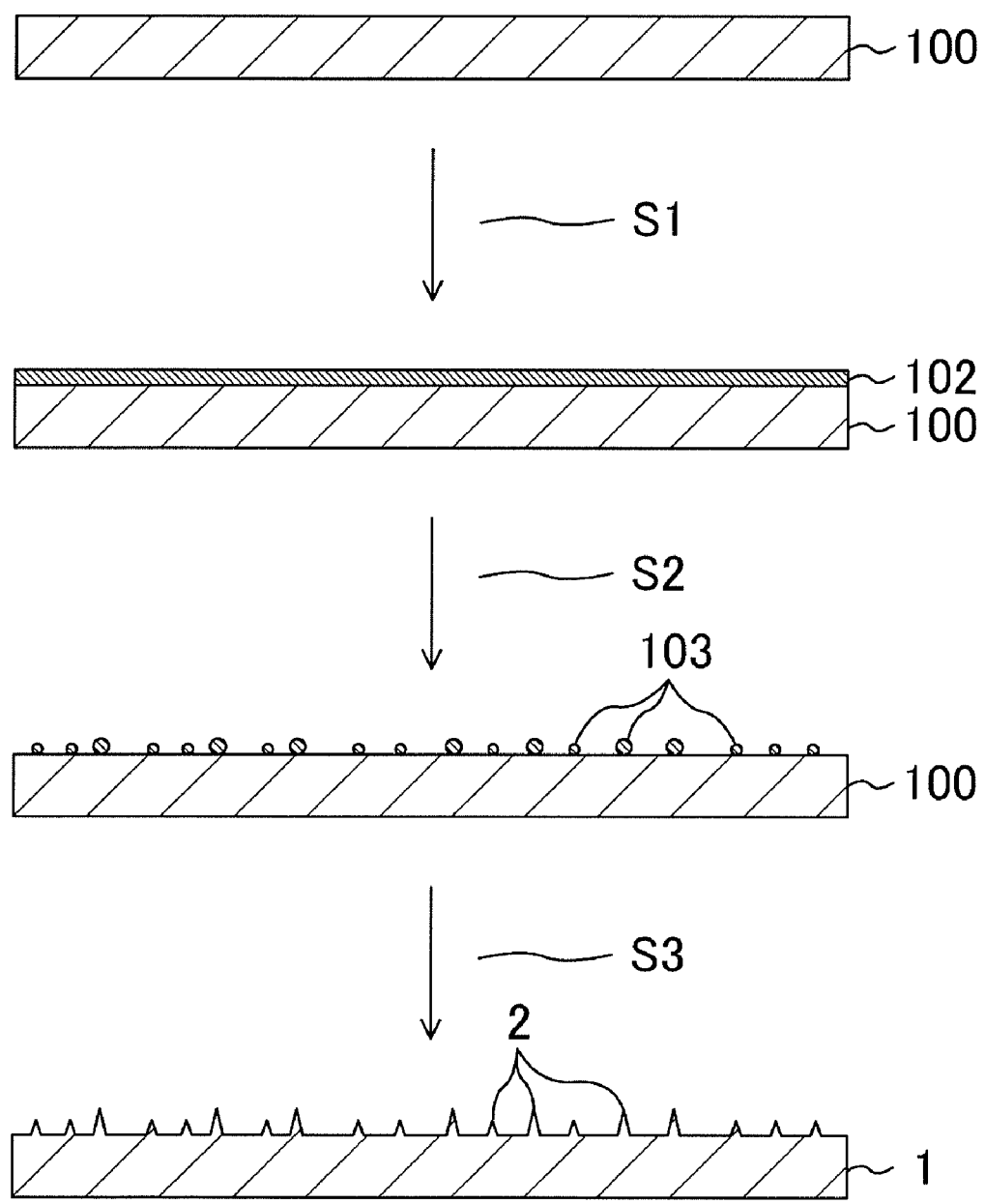
FIG. 1 is a view schematically illustrating process steps of forming a sapphire substrate according to an embodiment.

Embodiments of the present disclosure will be described in detail hereinafter with reference to the drawings. In the drawings, like reference characters have been used to designate identical or equivalent elements for simplicity of description.

First Embodiment

A method for forming a sapphire substrate 1 according to a first embodiment will be described based on a flow of formation schematically shown in FIG. 1.
<Preparation of Thin Sapphire Plate>
A disc-shaped thin sapphire plate 100 made of single crystal with a corundum structure of $Al_2O_3$ is prepared. The thin sapphire plate 100 has a diameter of 50 mm to 300 mm, and a thickness of 0.3 mm to 3 mm. The thin sapphire plate 100 can be formed at a cost much lower than a thin GaN plate, and is much superior to a thin Si plate in device performance in view of light transmittance. In addition, a surface (i.e., a principal surface) of the thin sapphire plate 100 on which a GaN layer is to be formed in formation of a compound semiconductor, which will be described later, may be an a plane <{11-20} plane>, a c plane <(0001) plane>, an m plane <{1-100} plane>, or an r plane <{1-102} plane>, or may be a crystal plane of another plane orientation.

Figure 2:
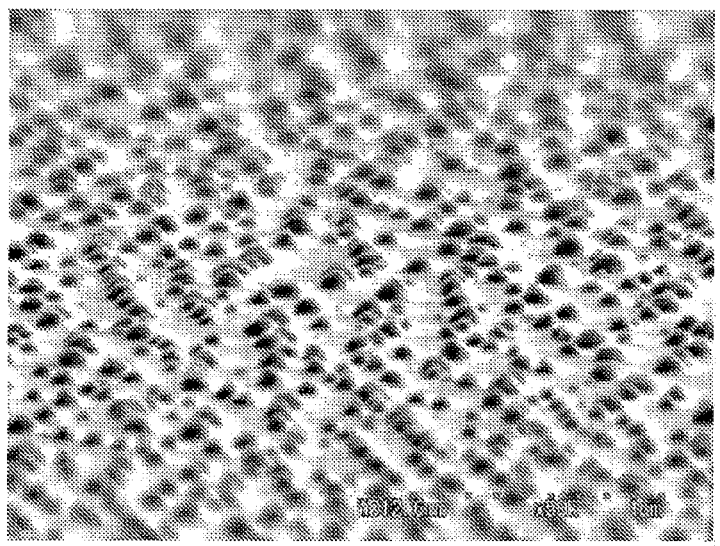
FIG. 2 is an SEM photograph showing a thin sapphire plate on which metal fine particles are provided according to the embodiment.

<Evaporation Process Step>
A metal is deposited by evaporation on a surface (i.e., the principal surface) of the thin sapphire plate 100, thereby forming a thin metal film 102 on the principal surface (step S1). The metal can be selected in consideration of the cost of the metal itself and the cost of the process step, and may be Ni or Pd, for example. The thickness of the thin metal film 102 varies depending on the size of necessary projections and conditions of subsequent process steps, and is preferably in the range from 1 nm to 20 nm, both inclusive. In this embodiment, the metal is Ni, and the thickness of the thin metal film 102 is 5 nm.
<Heat Treatment Process Step>
The thin sapphire plate 100 on which the thin metal film 102 is provided is subjected to heat treatment (annealing) in a vacuum or nitrogen atmosphere (step S2). This heat treatment changes the thin metal film 102 into the state of fine particles 103. FIG. 2 shows a state in which the fine particles 103 are provided on the thin sapphire plate 100.

Figure 3:
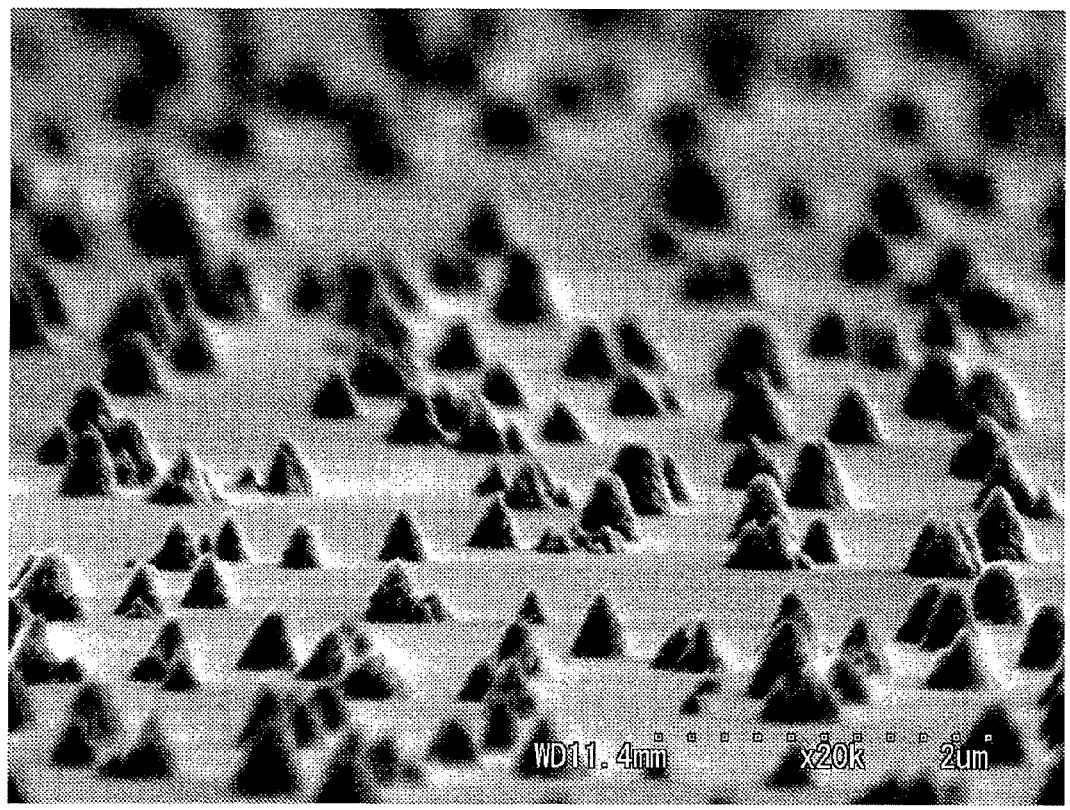
FIG. 3 is an SEM photograph showing a sapphire substrate according to the embodiment.

The fine particles 103 are preferably spheres or hemispheres. Conditions of the heat treatment is adjusted depending on the type of the metal, the thickness of the thin metal film 102, and the shape and size of fine particles 103 to be formed, for example. The metal fine particles 103 preferably have a diameter of 50 nm to 1 µm, both inclusive, when viewed from above the thin sapphire plate 100 (i.e., in a plan view from above). The size of the fine particles 103 has variations. In this embodiment, the annealing is performed at 850° C. for 22 seconds. The resultant metal fine particles 103 varies in size, but the largest one of the fine particles 103 is in the state of a sphere having a diameter of about 100 nm.
<Etching Process Step>
Using the metal fine particles 103 as a mask, the principal surface of the thin sapphire plate 100 is etched by inductive coupled plasma reactive ion etching (ICP-RIE) (step S3). The etching is sufficiently performed by adjusting etching conditions such that the metal fine particles 103 are removed, thereby forming a sapphire substrate 1 having a principal surface on which a plurality of projections 2, 2, . . . shown in the lowermost section of FIG. 1 are arranged at random. FIG. 3 shows an SEM photograph showing the sapphire substrate 1 in a slanting direction.

Figure 4:
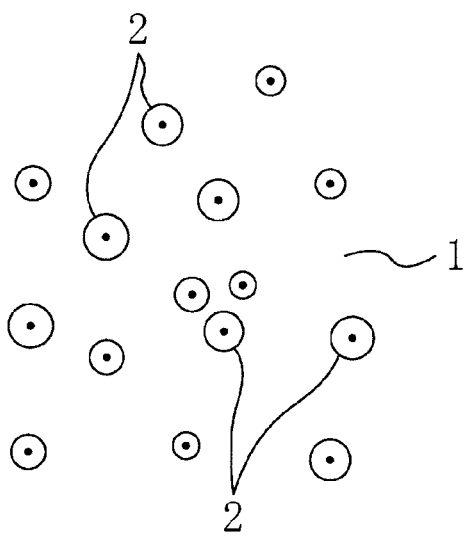
FIG. 4 is a plan view schematically illustrating the sapphire substrate of the embodiment.
Figure 5:
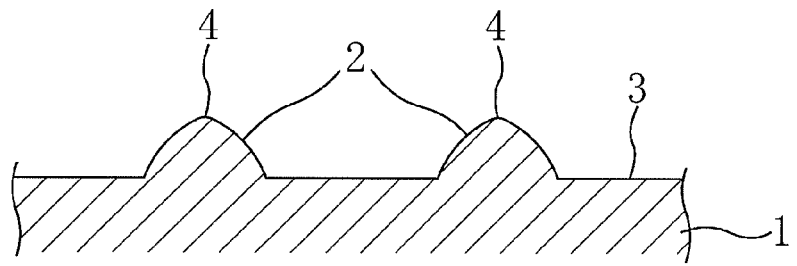
FIG. 5 is an enlarged cross-sectional view schematically illustrating the sapphire substrate of the embodiment.
Figure 8:
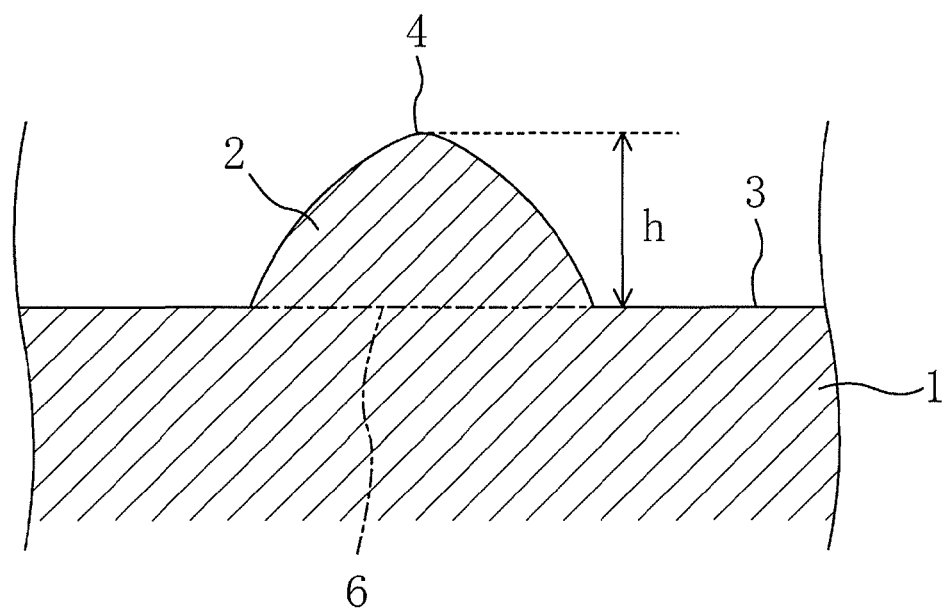
FIG. 8 is an enlarged cross-sectional view schematically illustrating a projection on the sapphire substrate.
Figure 9:
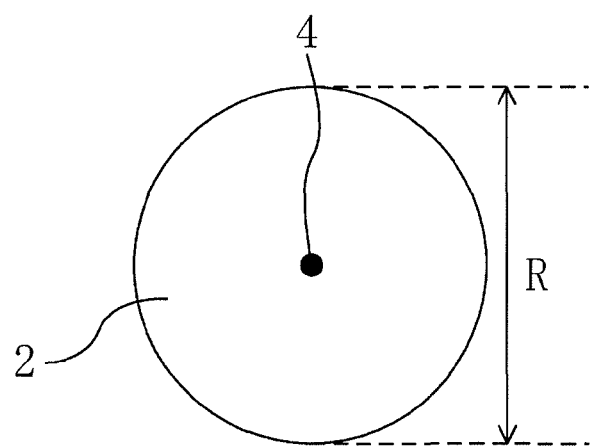
FIG. 9 is an enlarged plan view schematically illustrating the projection of the sapphire substrate.

FIG. 4 is a plan view showing the sapphire substrate 1 from above the principal surface thereof. FIG. 5 is a cross-sectional view of the sapphire substrate 1. FIG. 8 is an enlarged cross-sectional view schematically illustrating the projection 2.

As illustrated in FIG. 8, each of the projections 2 formed on the principal surface of the sapphire substrate 1 is in the shape of an approximate cone whose side surface is slightly curved upward, and is tapered from the bottom 6 to the top 4 thereof. The bottom 6 is substantially circular. This circular shape is due to the shape of the metal fine particles 103, and the shape of the bottom 6 varies depending on the thickness of the thin metal film 102 and annealing conditions. The top 4 is sharpened to some degree and substantially has no flat portions after the sufficient etching. The flat area of the top 4 does not exceed 0.05 µm², and is less than 0.001 µm² in average. The flat area of the top 4 is calculated on the assumption that the flat portion thereof is circular based on the cross-sectional SEM photograph.

The plurality of projections 2, 2, . . . vary in size, and preferably have an average height h of 100 nm to 1 µm, both inclusive, and about 300 nm in this embodiment. The average diameter (longer diameter) R of the bottom 6 is preferably in the range from 100 nm to 1 µm, both inclusive, and is about 300 nm in this embodiment. The distribution density of the projections 2 is preferably in the range from $1 \times 10^6/cm^2$ to $5 \times 10^{10}/cm^2$, both inclusive, and is $5 \times 10^8/cm^2$ in this embodiment. The curve in the side surface of each of the projections 2 means that the crystal plane continuously changes at the side surface.

The projections 2, 2, . . . are located at the same positions as the metal fine particles 103. The metal fine particles 103 are dispersed at random on the principal surface 3. The projections 2, 2, . . . are also arranged at random on the principal surface 3, i.e., are positioned without definite relationship. The sizes of the projections 2, 2, . . . differ from one another within a predetermined range. Accordingly, even when reflection, refraction, attenuation, and other phenomena of light due to the projections 2, 2, . . . interact each other (i.e., interfere each other), this interaction has no directivity, and thus, light is uniformly emitted in all the directions. Accordingly, as compared to the case of fabricating a semiconductor light-emitting device using a flat sapphire substrate with no projections 2, 2, . . . , the light-extraction efficiency is high, resulting in high optical output. To confirm these advantages, a semiconductor light-emitting device including a compound semiconductor layer is fabricated using the sapphire substrate 1 in the following manner.

<Formation of GaN Layer>

Figure 6:
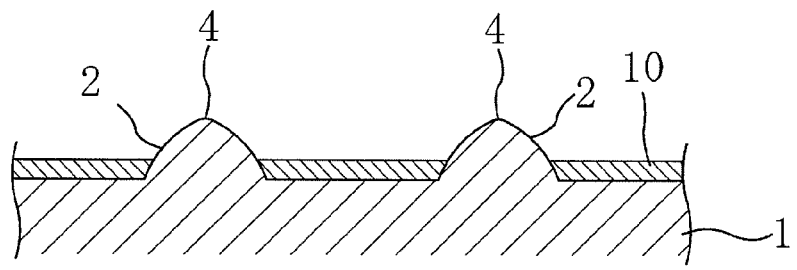
FIG. 6 is an enlarged cross-sectional view schematically illustrating an initial state of growth of a GaN layer in the embodiment.
Figure 7:
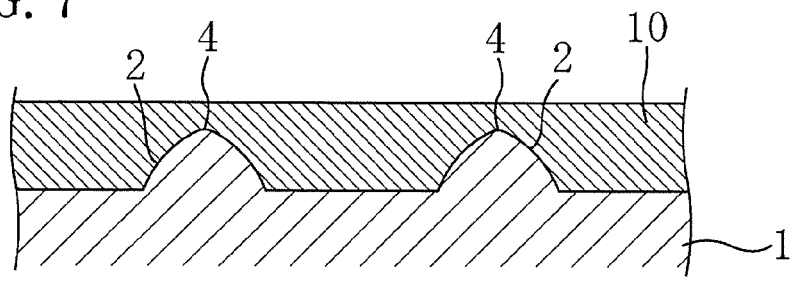
FIG. 7 is an enlarged cross-sectional view schematically illustrating a state in which projections are buried in the GaN layer in the embodiment.

A GaN layer is grown by metal organic vapor phase epitaxy (MOPVE) on the principal surface 3 of the sapphire substrate 1 including the projections 2, 2, . . . . In this process step, the GaN layer is doped with Si, thereby forming n-GaN. FIG. 6 is a cross-sectional view schematically illustrating an initial state of growth of the GaN layer 10. FIG. 7 is a cross-sectional view schematically illustrating a state in which the GaN layer 10 is grown to have a thickness larger than the height of the projections 2.

As illustrated in FIG. 6, the GaN layer 10 is grown on the principal surface 3 of the sapphire substrate 1 except for the projections 2, and is not grown on the side surface and the tops 4 of the projections 2. Since the crystal plane of a specific orientation is not exposed at the side surface of each of the projections 2, nuclei serving as start points of growth of GaN are not easily formed thereon. On the other hand, a crystal plane of a specific orientation is exposed at the entire principal surface 3 of the sapphire substrate 1, and thus, nuclei of GaN are easily formed, allowing growth of the GaN layer 10. Specifically, since the crystal plane continuously changes at the side surfaces of the projections 2, crystal growth of GaN from the side surfaces of the projections 2 is inhibited. Since the tops 4 of the projections 2 have no flat portions or have very small flat portions, no GaN layer 10 is grown thereon.

As illustrated in FIG. 7, as the thickness of the GaN layer 10 increases, the surfaces of the projections 2 are gradually covered with the GaN layer 10 growing in the lateral direction (i.e., the horizontal direction). When the thickness of the GaN layer 10 finally reaches and exceeds the height of the projections 2, the projections 2 are completely covered with the GaN layer 10. In this state, only the surface of the flat GaN layer 10 is observed when viewed from above.

In this embodiment, the GaN layer 10 is grown until the thickness of the GaN layer 10 finally reaches 6 μm. The dislocation density of this GaN layer 10 is evaluated by cathodeluminescence (CL). Scotomas observed by CL are threading dislocations appealing at the surface of the GaN layer 10. Accordingly, the scotoma density substantially corresponds to the dislocation density. The density of scotomas observed in this embodiment is substantially equal to the density of scotomas observed in the GaN layer grown on a conventional striped sapphire substrate (i.e., a PSS in which a plurality of parallel grooves are formed in the substrate surface). In fabricating a semiconductor light-emitting device which will be described below, immediately after the GaN layer 10 is grown, a next compound semiconductor layer is grown without observation of scotomas.

<Fabrication of Semiconductor Light-Emitting Device>

Figure 10:
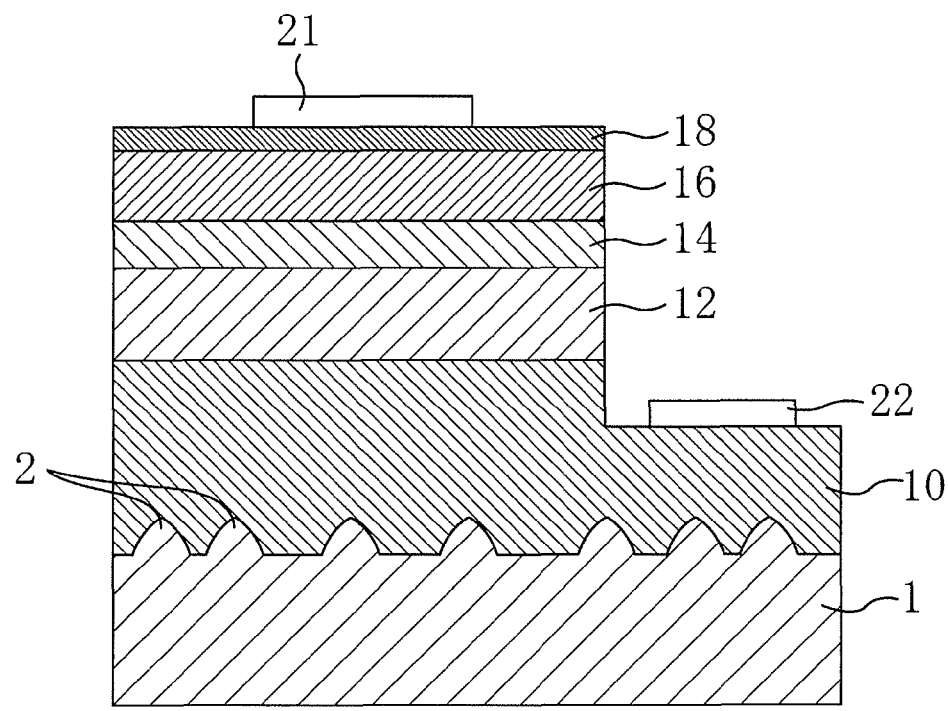
FIG. 10 is an enlarged cross-sectional view schematically illustrating a semiconductor light-emitting device according to the embodiment.

A plurality of compound semiconductor layers and electrodes are formed on the GaN layer 10 on the sapphire substrate 1, thereby fabricating a semiconductor light-emitting device illustrated in FIG. 10. This fabrication will be described hereinafter.

First, InGaN layers and GaN layers are alternately grown a plurality of times on the GaN layer 10, thereby forming a multi-quantum well layer 12. Then, a p-AlGaN layer 14 doped with Mg is grown on the multi-quantum well layer 12. Thereafter, a p-GaN layer 16 doped with Mg is grown on the p-AlGaN layer 14. Subsequently, an ITO layer 18 as a transparent electrode is formed by electron-beam evaporation on the p-GaN layer 16.

Next, the stack of the compound semiconductor layers is partially etched using an ICP-RIE, thereby exposing the GaN layer 10. Thereafter, an n-type electrode 22 made of Ti/Al (i.e., a multilayer structure) is formed by electron-beam evaporation on the exposed GaN layer 10. A p-type electrode 21 made of Ti/Al is formed on the ITO layer 18. In this manner, a semiconductor light-emitting device is fabricated.

<Characteristics of Semiconductor Light-Emitting Device>

Light-emission output of the semiconductor light-emitting device (i.e., the semiconductor device) of this embodiment fabricated in the foregoing manner was measured using an automatic probe tester WPSR3100 produced by OPTO-SYSTEM Co., Ltd. For comparison, a reference light-emitting device employing a sapphire substrate with a flat principal surface (i.e., without projections), having the same configuration except for the substrate, and fabricated in the same manner as the semiconductor light-emitting device of this embodiment was prepared. Then, light-emission output was measured in the same manner as in this embodiment.

Suppose that light-emission output of the reference light-emitting device when receiving a current of 20 mA is 100, light-emission output of the semiconductor light-emitting device of this embodiment was 144, and an increase in the output by 44% was confirmed. In addition, the semiconductor light-emitting device of this embodiment uniformly emitted light from the entire surface. In this manner, a semiconductor light-emitting device fabricated by forming projections 2, 2, . . . at random on the principal surface 3 of the sapphire substrate 1, and forming compound semiconductor layers on the sapphire substrate 1, exhibits an increased luminous efficiency and obtains uniform light emission. The sapphire substrate 1 of this embodiment can be formed without being subjected to photolithography using a photomask. Thus, the fabrication cost and the time necessary for fabrication can be reduced.

Second Embodiment

Figure 11:
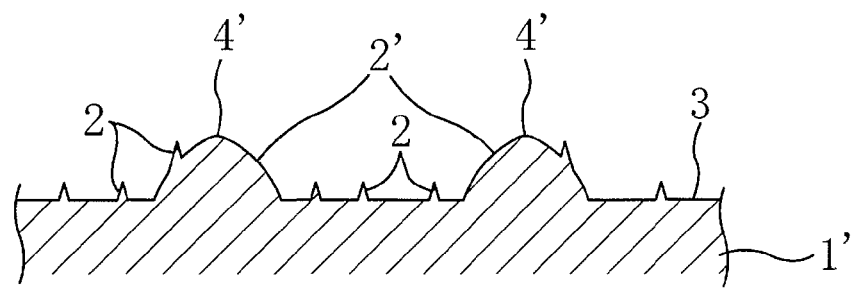
FIG. 11 is a plan view schematically illustrating a sapphire substrate according to another embodiment.

A second embodiment of the present disclosure differs from the first embodiment in a thin sapphire plate, and the other part of the configuration is the same as in the first embodiment. Thus, aspects different from those in the first embodiment will be described hereinafter. FIG. 11 shows a sapphire substrate 1' of this embodiment.

In the thin sapphire plate of this embodiment, a plurality of convex shapes 2' are previously arranged at random on a principal surface 3. Each of the convex shapes 2' is tapered from the bottom to the top thereof. The density of the convex shapes 2' is in the range from $1 \times 10^5/cm^2$ to $5 \times 10^7/cm^2$, both inclusive. The area of a flat portion of the top 4' of each of the convex shapes 2' is larger than 0 (zero) and smaller than or equal to 10 μm². The bottom surface of each of the convex shapes 2' has a longer diameter of 1 μm to 50 both inclusive, and a shorter diameter of 100 nm to 10 μm, both inclusive. Using this thin sapphire plate, a sapphire substrate 1' illustrated in FIG. 11 is obtained through process steps substantially the same as in the first embodiment.

In the second embodiment, the same advantages as those in the first embodiment can be obtained.

Other Embodiments

The foregoing embodiments are examples of the present disclosure, and the present disclosure is not limited to these examples. The shape of the projections 2 is not limited to an approximate cone, and may be an approximate hemisphere, for example. In the first or second embodiment, the thin sapphire plate may employ a pattern of a plurality of parallel grooves or geometric shapes in which domes, cylindrical columns, square poles, or hexagonal projections are regularly arranged as described in PATENT DOCUMENT 1. For example, a plurality of projections of the first or second embodiment may be provided on a flat portion of the top of each of the square poles.

The average height of the projections 2 is preferably in the range from 100 nm to 1 μm, both inclusive, and more preferably 800 nm or less.

The shape of the bottom 6 of each of the projections 2 is not limited to circular, and may be an indefinite shape surrounded by an ellipse or a curve. The longer diameter R of the bottom 6 is preferably in the range from 100 nm to 1 μm, both inclusive.

The density of distribution of the projections 2 is preferably in the range from $1\times10^6/cm^2$ to $5\times10^{10}/cm^2$, both inclusive. If the density of distribution of the projections 2 is lower than $1\times10^6/cm^2$, the degree of an increase in the light-extraction efficiency is small. On the other hand, if the density is higher than $5\times10^{10}/cm^2$, the projections overlap with one another in large area, resulting in that defects are likely to occur in crystal growth.

Layers forming the semiconductor light-emitting device can be grown with known techniques.

The semiconductor layer to be grown on the principal surface 3 of the sapphire substrate 1 is not limited to the GaN layer 10, and may be a compound semiconductor layer of, for example, AlN or InGaN.

The degree of increase in the light-extraction efficiency obtained by random arrangement of a plurality of projections is equal to that obtained in a PSS with a plurality of parallel grooves. When no projections are provided, light confined in the GaN layer due to total internal reflection can be taken out of the GaN layer (and further out of the LED device) by a light scattering effect.

INDUSTRIAL APPLICABILITY

As described above, a sapphire substrate according to the present disclosure can serve as a substrate of a semiconductor light-emitting device capable of uniformly emitting light with high efficiency, and thus, is useful for use in illumination or other equipment.

DESCRIPTION OF REFERENCE CHARACTERS 1, 1' sapphire substrate
2 projection
2' convex shape
3 principal surface
4 top of projection
6 bottom of projection
100 thin sapphire plate
102 thin metal film
103 fine particles

The invention claimed is:

1. A method for forming a sapphire substrate, the method comprising the steps of:
   (A) depositing a metal by evaporation on a surface of a thin sapphire plate;
   (B) performing heat treatment on the thin sapphire plate, thereby changing the metal into a fine particle state, after step A; and
   (C) etching the surface of the thin sapphire plate using the metal in the fine particle state as a mask to simultaneously remove the fine metal particles and to form convex shapes under the locations of the fine metal particles, wherein
   each of the convex shapes is tapered from a bottom thereof to a top thereof,
   the convex shapes are arranged at a density of $1\times10^5/cm^2$ to $5\times10^7/cm^2$, both inclusive,
   a flat portion of the top of each of the convex shapes has an area larger than 0 and smaller than or equal to 10 μm², and
   a bottom surface of each of the convex shapes has a longer diameter of 1 μm to 50 μm, both inclusive, and a shorter diameter of 100 nm to 10 μm, both inclusive.

2. The method of claim 1, wherein in step (A), the metal is deposited by evaporation to have a thickness from 1 nm to 20 nm, both inclusive.

3. The method of claim 1, wherein in step (C), the convex shapes formed on the surface are arranged at random on the surface, and
   a flat portion of the top of each of the projections has an area of 0 μm² to 0.05 μm², both inclusive.

4. The method of claim 3, wherein a bottom surface of each of the convex shapes has a longer diameter of 100 nm to 1 μm, both inclusive, and a shorter diameter of 50 nm to 0.5 μm, both inclusive.

5. The method of claim 3, wherein each of the projections has a curved side surface.

6. The method of one of claim 3, wherein each of the projections has a height of 100 nm to 1 μm, both inclusive.

7. A semiconductor device, comprising:
   a sapphire substrate having a surface on which a plurality of convex shapes and a plurality of projections are formed; and
   a compound semiconductor layer provided on the surface of the sapphire substrate, wherein
   the convex shapes are provided at random on the surface of the sapphire substrate, arranged at a density of $1\times10^5/cm^2$ to $5\times10^7/cm^2$, both inclusive, and each tapered from a bottom thereof to a top thereof,
   a flat portion of the top of each of the convex shapes has an area larger than 0 and smaller than or equal to 10 μm²,
   a bottom surface of each of the convex shapes has a longer diameter of 1 μm to 50 μm, both inclusive, and a shorter diameter of 100 nm to 10 μm, both inclusive, and
   the projections are arranged at random on the surface,
   each of the projections is tapered from a bottom thereof to a top thereof,
   a flat portion of the top of each of the projections has an area of 0 μm² to 0.05 μm², both inclusive, and at least one of the projections is located on at least one of the convex shapes.

8. The semiconductor device of claim 7, wherein a bottom surface of each of the projections has a longer diameter of 100 nm to 1 µm, both inclusive, and a shorter diameter of 50 nm to 0.5 µm, both inclusive.

9. The semiconductor device of claim 7, wherein each of the projections has a curved side surface.

10. The semiconductor device of one of claim 7, wherein each of the projections has a height of 100 nm to 1 µm, both inclusive.

11. The semiconductor device of one of claim 7, wherein light is emitted from the compound semiconductor layer.

12. A method for forming a sapphire substrate, the method comprising the steps of:

(A) depositing a metal by evaporation on a surface of a thin sapphire plate;
(B) performing heat treatment on the thin sapphire plate, thereby changing the metal into a fine particle state, after step A; and
(C) etching the surface of the thin sapphire plate using the metal in the fine particle state as a mask to simultaneously remove the fine metal particles and to form convex shapes under the locations of the fine metal particles, such that each of the convex shapes is tapered from a bottom thereof to a top thereof, and the convex shapes are arranged at random on the surface.

* * * * *